United States Patent
Jung

(10) Patent No.: US 7,282,318 B2
(45) Date of Patent: *Oct. 16, 2007

(54) PHOTORESIST COMPOSITION FOR EUV AND METHOD FOR FORMING PHOTORESIST PATTERN USING THE SAME

(75) Inventor: Jae Chang Jung, Seoul (KR)

(73) Assignee: Hynix Semiconductor Inc., Kyungki-do (KR)

( * ) Notice: Subject to any disclaimer, the term of this patent is extended or adjusted under 35 U.S.C. 154(b) by 20 days.

This patent is subject to a terminal disclaimer.

(21) Appl. No.: 10/875,912

(22) Filed: Jun. 24, 2004

(65) Prior Publication Data

US 2005/0106497 A1   May 19, 2005

(30) Foreign Application Priority Data

Nov. 19, 2003   (KR) ...................... 10-2003-0082142

(51) Int. Cl.
*G03F 7/004* (2006.01)
*G03F 7/20* (2006.01)
*G03F 7/30* (2006.01)

(52) U.S. Cl. .................. 430/270.1; 430/331; 430/311; 430/905; 430/914; 430/966; 430/945; 430/942; 430/919; 430/909; 526/307.4; 526/307.5

(58) Field of Classification Search ............. 430/270.1, 430/311, 331, 905, 914, 909, 919, 966, 942, 430/945; 526/307.4, 307.5
See application file for complete search history.

(56) References Cited

U.S. PATENT DOCUMENTS 4,046,577 A * 9/1977 Muzyczko et al. ...... 430/280.1
5,212,043 A    5/1993 Yamamoto et al.
5,262,280 A * 11/1993 Knudsen et al. ............ 430/312
5,750,680 A    5/1998 Kim et al.
5,876,899 A * 3/1999 Szmanda et al. ......... 430/270.1
6,030,747 A    2/2000 Nakano et al.
6,051,678 A    4/2000 Kim et al.
6,132,926 A   10/2000 Jung et al.
6,143,463 A   11/2000 Jung et al.
6,150,069 A   11/2000 Jung et al.

(Continued)

FOREIGN PATENT DOCUMENTS

EP    0 789 278 A2    8/1997

(Continued)

OTHER PUBLICATIONS

Korean Intellectual Property Office official action dated Jun. 28, 2006, issued in connection with the Korean priority application No. 10-2003-0082142, and English-language translation thereof.

(Continued)

*Primary Examiner*—Amanda Walke
(74) *Attorney, Agent, or Firm*—Marshall, Gerstein & Borun LLP

(57) ABSTRACT

The present invention relates to photoresist compositions for EUV and methods for forming photoresist patterns. More specifically, fine photoresist patterns: of less than 50 nm without collapse are formed with EUV (Extreme Ultraviolet) as an exposure light source by using a negative photoresist composition comprising a melamine derivative and polyvinylphenol.

24 Claims, 2 Drawing Sheets

U.S. PATENT DOCUMENTS

| | | | |
|---|---|---|---|
| 6,180,316 B1 | 1/2001 | Kajita et al. | |
| 6,225,020 B1 | 5/2001 | Jung et al. | |
| 6,235,447 B1 | 5/2001 | Lee et al. | |
| 6,235,448 B1 | 5/2001 | Lee et al. | |
| 6,262,206 B1* | 7/2001 | Nesvadba et al. | 526/220 |
| 6,368,773 B1* | 4/2002 | Jung et al. | 430/281.1 |
| 6,455,706 B2* | 9/2002 | Nesvadba et al. | 548/542 |
| 6,482,565 B1* | 11/2002 | Jung et al. | 430/270.1 |
| 2004/0265743 A1* | 12/2004 | Lee et al. | 430/281.1 |

FOREIGN PATENT DOCUMENTS

| | | |
|---|---|---|
| EP | 0 794 458 A2 | 9/1997 |
| EP | 1 193 555 A1 | 4/2002 |
| EP | 1406122 A2 * | 4/2004 |
| GB | 2 345 286 A | 7/2000 |
| WO | WO96/08472 | 3/1996 |
| WO | WO96/37526 | 11/1996 |
| WO | WO97/33198 | 9/1997 |

OTHER PUBLICATIONS

Chinese Intellectual Property Office official action dated Jul. 28, 2006, issued in connection with Chinese counterpart application No. 2004-100696349, and English-language translation thereof.

* cited by examiner

PHOTORESIST COMPOSITION FOR EUV AND METHOD FOR FORMING PHOTORESIST PATTERN USING THE SAME

BACKGROUND

1. Technical Field

The present invention relates to photoresist compositions for EUV and methods for forming photoresist patterns using the same. More specifically, the method for forming less than 50 nanometers (nm) fine photoresist patterns without collapse thereof are disclosed by using a negative photoresist composition comprising a melamine derivative and polyvinylphenol and using EUV (Extreme Ultraviolet) as an exposing light source.

2. Background of the Related Art

As device design of semiconductors become smaller, it is impossible to form less than 50 nm microfine photoresist patterns using KrF (248 nm) and ArF (193 nm) and general photoresists. Recently, a lithography process has been developed to integrate many circuits in a smaller area by using light sources of short wavelength and chemical amplification type DUV (Deep Ultraviolet) photoresists which react with above short wavelength light.

The short wavelength light sources are EUV (Extreme Ultraviolet) (13 nm), ion-beam, and X-ray. Since EUV makes possible to design circuits of less than 0.1 micrometers (μm), it expects that semiconductor devices having 100 times more capacity and 100 times faster speed than those manufactured by currently used processes can be manufactured by a process using EUV.

In the DUV photoresist, a photoacid generator therein produces acid when illuminated by the light source, and the main chain or branched chain of a matrix polymer reacts with the produced acid in the baking process and is decomposed or crosslinked, so that polarity of the polymer is considerably altered. This polarity alteration results in a solubility difference in a developing solution between an exposed area and an unexposed area.

For example, in the case of a positive photoresist, acid is generated in the exposed area, and the generated acid reacts with the matrix polymer in the baking process after exposure so that the main chain or branched chain of the polymer is decomposed and dissolved in a subsequent developing process. In the case of a negative photoresist, acid is produced in the exposed area, and the main chain or branched chain of the polymer causes a cross-linking reaction by the produced acid and becomes insoluble. As a result, the polymer is not dissolved in the subsequent developing step, thereby forming a negative image of a mask on a substrate.

As described above, since resolution in the lithography process depends on wavelength of a light source, more microfine patterns may be formed using the light source of smaller wavelength. In order to practically realize the technology forming microfine patterns of less than 50 nm, photoresist materials such as the photoresist having high sensitivity to ion-beam radiation or the EUV as well as cost-effective exposing and irradiating equipment suitable for EUV are required.

However, in the current lithography process to form patterns of less than 50 nm by using a conventional photoresist and EUV, the patterns are collapsed after development. As a result, a lithography process preventing pattern collapse after development is required.

SUMMARY OF THE DISCLOSURE

Accordingly, disclosed herein are photoresist compositions useful for a photolithography process, particularly, those processes using EUV to form microfine patterns of less than 50 nm. Generally, the composition includes a melamine derivative, a polyvinylphenol type polymer, a photoacid generator, and an organic solvent.

Also, disclosed herein are methods for forming photoresist patterns using the disclosed photoresist composition for EUV. The methods generally include locating the photoresist composition on a top portion of an underlying layer to be etched to form a photoresist film, exposing the photoresist film to light, baking the exposed photoresist film, and developing the resulting structure to obtain a photoresist pattern.

DETAILED DESCRIPTION OF THE PRESENTLY PREFERRED EMBODIMENTS

Figure 1:
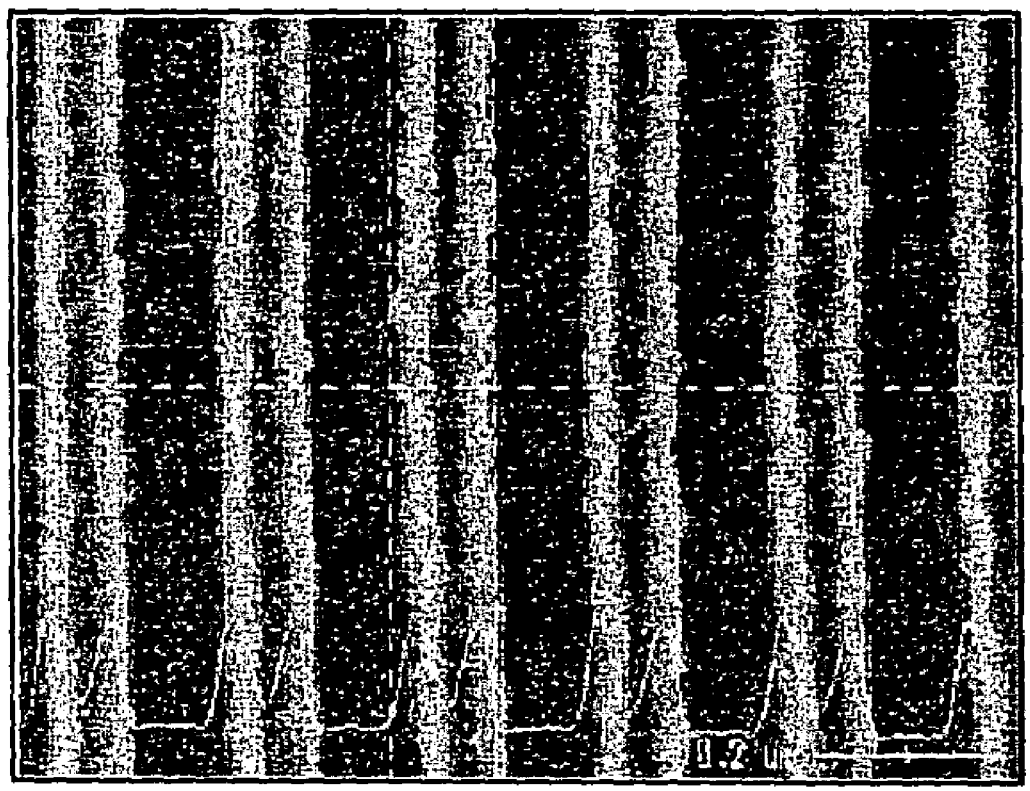
FIG. 1 is a photograph illustrating a photoresist pattern obtained from Example 3.

A negative photoresist composition of the present invention includes a melamine derivative, a polyvinylphenol type polymer, a photoacid generator and an organic solvent.

The melamine derivative is represented by Formula 1:

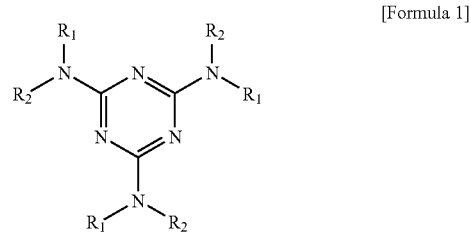

[Formula 1]

wherein
$R_1$ and $R_2$ are individually a $C_1$–$C_{20}$ alkyl or $C_1$–$C_{10}$ ether group. $C_1$–$C_{10}$ ether group may be —$C_2H_5OC_2H_6$, —$CH_2OCH_2CH_3$, —$CH_2OCH_3$, or cyclic ethers, such as tetrahydrofuran. Preferably, the melamine derivative is a compound represented by Formula 1a:

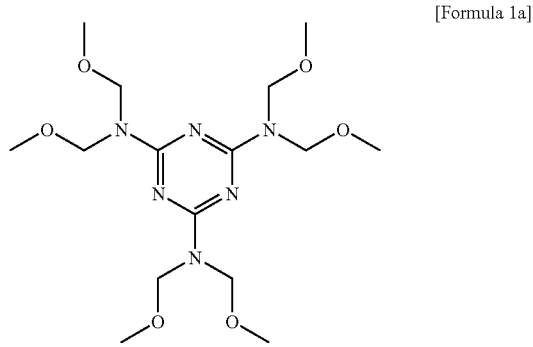

[Formula 1a]

The polyvinylphenol polymer as a base resin of the negative photoresist composition is a blend polymer having a molecular weight ranging from 5,000 to 9,000, and preferably 8,000. The polyvinylphenol polymer preferably comprises the blend polymer of poly(N,N-dimethylacrylamide/3,3-dimethoxypropene/acrolein) and polyvinylphenol.

In this blend polymer, the melamine derivative is present in an amount ranging from 0.1 weight percent (wt %) to 20 wt %, preferably from 0.1 wt % to 17 wt %, based on the total weight of the photoresist composition. The polyvinylphenol polymer is present in an amount ranging from 2.5 wt % to 15 wt %, preferably from 3 wt % to 13 wt %, based on the total weight of the photoresist composition.

The photoacid generator can be any of the known protective groups which can produce acid by light exposure, including, for example, the conventional photoacid generators disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001), and U.S. Pat. No. 6,235,447 B1 (May 22, 2001). Sulfide type or onium type compounds are mostly used for the photoacid generator. The photoacid generator is preferably selected from the group consisting of phthalimidotrifluoromethane sulfonate, dinitrobenzyltosylate, n-decyl disulfone, and naphthylimido trifluoromethane sulfonate, which have low light absorbance at 157 nm and 193 nm. Additionally, the photoacid generator further comprises any one selected from the group consisting of diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, triphenylsulfonium hexafluoroarsenate, triphenylsulfonium hexafluoroantimonate, triphenylsulfonium triflate, and dibutylnaphthylsulfonium triflate.

The photoacid generator is present in an amount ranging from 0.05 wt % to 10 wt %, based on total weight of the polyvinylphenol polymer. It has been found that the photoacid generator lowers photosensitivity of the photoresist composition when used in the amount of less than 0.05 wt %. However, when used in the amount of more than 10 wt %, the photoacid generator absorbs far ultraviolet rays and generates large amount of acids, thereby resulting in the formation of patterns with poor profile.

The organic solvent can be any of the known protective groups including, for example, the conventional organic solvents disclosed in U.S. Pat. No. 5,212,043 (May 18, 1993), WO 97/33198 (Sep. 12, 1997), WO 96/37526 (Nov. 28, 1996), EP 0 794 458 (Sep. 10, 1997), EP 0 789 278 (Aug. 13, 1997), U.S. Pat. No. 5,750,680 (May 12, 1998), U.S. Pat. No. 6,051,678 (Apr. 18, 2000), GB 2,345,286 A (Jul. 5, 2000), U.S. Pat. No. 6,132,926 (Oct. 17, 2000), U.S. Pat. No. 6,143,463 (Nov. 7, 2000), U.S. Pat. No. 6,150,069 (Nov. 21, 2000), U.S. Pat. No. 6,180,316 B1 (Jan. 30, 2001), U.S. Pat. No. 6,225,020 B1 (May 1, 2001), U.S. Pat. No. 6,235,448 B1 (May 22, 2001) and U.S. Pat. No. 6,235,447 B1 (May 22, 2001). Preferably, the organic solvent is selected from diethylene glycol diethyl ether, methyl 3-methoxypropionate, ethyl 3-ethoxypropionate, propyleneglycol methyletheracetate, cyclohexanone, and mixtures thereof.

Here, the organic solvent is present in an amount ranging from 500 wt % to 2000 wt %, based on the total weight of the photoresist polymer to obtain a photoresist film having a desired thickness. For example, when the organic solvent is present in the amount of 1000 wt % to the photoresist polymer, the thickness of photoresist is about 0.25 µm.

A method for forming a photoresist pattern comprises the steps of:

(a) coating the photoresist composition of the present invention on top portion of an underlying layer to be etched to form a photoresist film;

(b) exposing the photoresist film to light;

(c) baking the exposed photoresist film; and, (d) developing the resulting structure to obtain a photoresist pattern.

The above method can further comprise an additional baking step before the exposing step (b). Preferably, the baking step is performed at a temperature ranging from 70° C. to 200° C.

The exposing step (b) is performed using a light source selected from the group consisting of EUV, KrF, ArF, VWV (Vacuum Ultra Violet), E-beam, X-ray or ion-beam with exposure energy ranging from one milliJoule per square centimeter ($mJ/cm^2$) to 100 $mJ/cm^2$.

The developing step (d) can be performed with an alkaline developing solution which is preferably TMAH aqueous solution ranging from 0.01 wt % to 5 wt %.

The reaction mechanism of the negative photoresist composition of the present invention is as follows. The photoacid generator produces acid when it is exposed to ultraviolet rays from the light source. In the baking process after exposure, the acid causes polyvinylphenol as a base resin to cross-link with the melamine derivative of Formula 1. As a result, the polymer becomes insoluble in the subsequent developing step. However, since the cross-linking reaction does not occur in the unexposed area, the polymer is dissolved in the subsequent developing step, thereby forming a negative image of a mask on the substrate.

Additionally, the present invention provides a semiconductor device manufactured by the method of the present invention described hereinbefore.

The photoresist composition of the present invention will be described in more detail referring to the following non-limiting examples.

I. Preparation of Photoresist Compositions

EXAMPLE 1

To 110 grams (g) of propylene glycol methyl ether acetate (PGMEA) were added 10 g of polyvinylphenol polymer (M.W 8000), 1 g of the melamine derivative of Formula 1a and 0.5 g of triphenylsulfonium triflate as a photoacid generator. The resulting mixture was filtered through a 0.20 µm filter to obtain a photoresist composition of the present invention.

EXAMPLE 2

To 150 g of PGMEA were added 10 g of polyvinylphenol polymer (M.W 8000), 5 g of the melamine derivative of Formula 1a and 0.6 g of triphenylsulfonium triflate. The resulting mixture was filtered through a 0.20 µm filter, to obtain a photoresist composition of the present invention.

II. Formation of Photoresist Patterns

EXAMPLE 3

The photoresist composition obtained from Example 1 was spin-coated on top portion of an underlying layer to be etched in a silicon wafer to prepare a photoresist film, and soft-baked in oven or on hot plate at about 130° C. for 90 seconds. After baking, the photoresist was exposed to light using a KrF laser exposer of ASML Co., Ltd, and then post-baked at about 130° C. for 90 seconds.

When the post-baking was completed, the wafer was developed in a 2.38 wt % TMAH solution for about 40 seconds, to obtain 130 nm L/S pattern (see FIG. 1).

EXAMPLE 4

The photoresist composition obtained from Example 2 was spin-coated on a top portion of an underlying layer to be etched in a silicon wafer to prepare a photoresist film, and soft-baked in oven or on hot plate at about 130° C. for 90 seconds. After baking, the photoresist was exposed to light using a KrF laser exposer of ASML Co., Ltd, and then post-baked at about 130° C. for 90 seconds.

Figure 2:
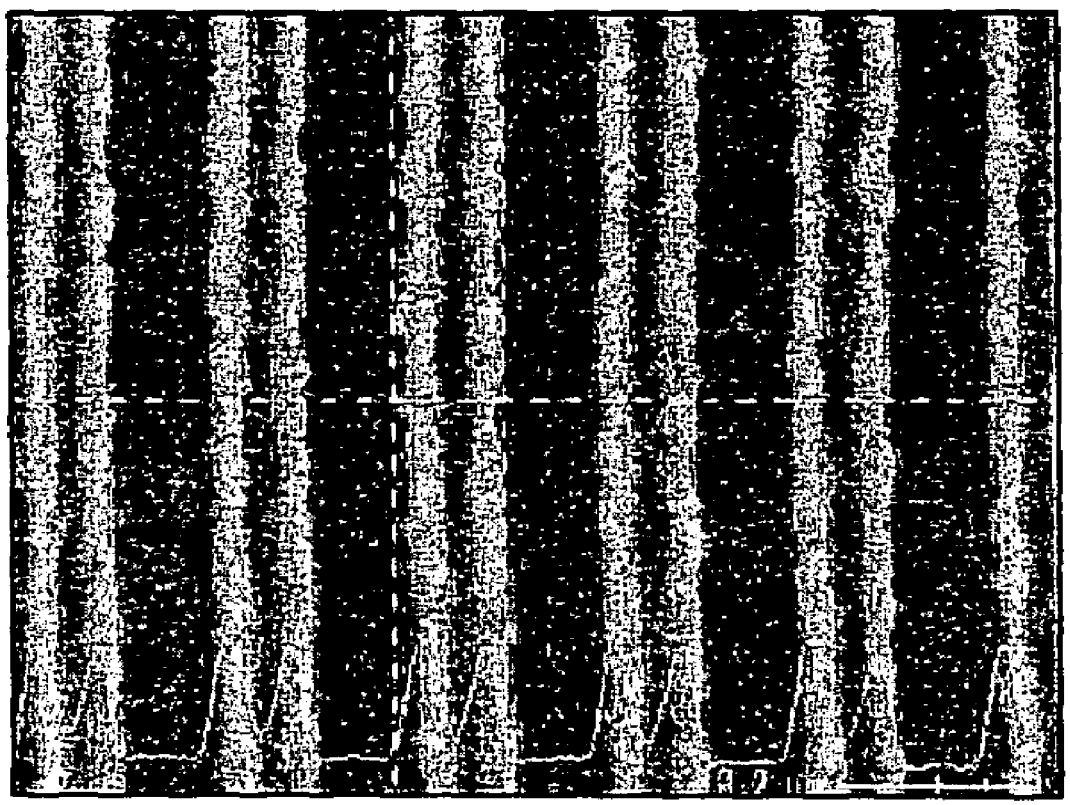
FIG. 2 is a photograph illustrating a photoresist pattern obtained from Example 4.

When the post-baking was completed, the wafer was developed in a mixture solution of ethanol/distilled water (200 g/800 g) for about 40 seconds, to obtain 130 nm L/S pattern (see FIG. 2).

As discussed hereinbefore, microfine photoresist patterns of less than 50 nm without collapse can be formed with EUV as an exposing light source by using the photoresist composition of the present invention comprising polyvinylphenol as well as the melamine derivative of Formula 1, wherein they are under cross-linking reaction by the acid generated in the exposing step.

What is claimed is:

1. A photoresist composition comprising:
   (a) a melamine derivative,
   (b) a blend polymer of poly(N,N-dimethacrylamide/ 3,3-dimethoxypropene/acrolein) and polyvinylphenol,
   (c) a photoacid generator, and
   (d) an organic solvent.

2. The photoresist composition according to claim 1, wherein the melamine derivative is a compound represented by Formula 1:

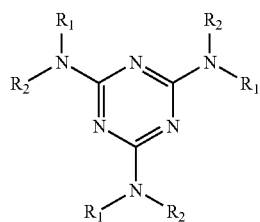

[Formula 1]

wherein $R_1$ and $R_2$ are individually a $C_1$–$C_{20}$ alkyl or $C_1$–$C_{10}$ ether group.

3. The photoresist composition according to claim 1, wherein the melamine derivative is a compound represented by Formula 1a:

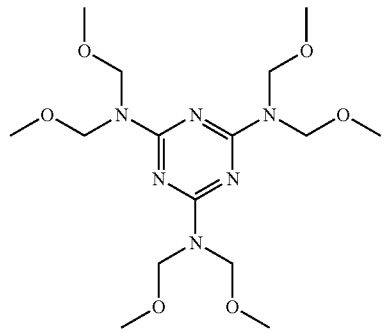

[Formula 1a]

4. The photoresist composition according to claim 1, wherein the melamine derivative is present in an amount ranging from 0.1 wt % to 20 wt % based on total weight of the photoresist composition.

5. The photoresist composition according to claim 1, wherein the polymer has a molecular weight ranging from 5000 to 9000.

6. The photoresist composition according to claim 1, wherein the polymer is present in an amount ranging from 2.5 wt % to 15 wt % based on total weight of the photoresist composition.

7. The photoresist composition according to claim 1, wherein the photoacid generator is selected from the group consisting of phthalimidotrifluoromethane sulfonate, dinitrobenzyltosylate, n-decyl disulfone, and naphthylimido trifluoromethane sulfonate.

8. The photoresist composition according to claim 1, wherein the photoacid generator comprises
   i) a first photoacid generator selected form the group consisting of phthalimidotrifluoromethane sulfonate, dinitrobenzyltosylate, n-decyl disulfone, and naphthylimido trifluoromethane sulfonate; and
   ii) a second photoacid generator selected from the group consisting of diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, triphenylsulfonium hexafluoroarsenate, triphenylsulfonium hexafluoroantimonate, triphenylsulfonium triflate, and dibutylnaphthylsulfonium triflate.

9. The photoresist composition according to claim 1, wherein the photoacid generator is present in an amount ranging from 0.05 wt % to 10 wt % based on total weight of the photoresist polymer.

10. The photoresist composition according to claim 1, wherein the organic solvent is selected from diethylene glycol diethyl ether, methyl 3-methoxypropionate, ethyl 3-ethoxypropionate, propyleneglycol methyletheracetate, cyclohexanone, and mixtures thereof.

11. The photoresist composition according to claim 1, wherein the organic solvent is present in an amount ranging from 500 wt % to 2000 wt % based on total weight of the photoresist polymer.

12. A method for forming a photoresist pattern, comprising the steps of:
   (a) coating a photoresist composition on a top portion of an underlying layer to be etched to form a photoresist film;
   (b) exposing the photoresist film to EUV light;

(c) baking the exposed photoresist film; and
(d) developing the resulting structure to obtain a photoresist pattern;

wherein the photoresist composition comprises a melamine derivative, a polyvinylphenol type polymer, a photoacid generator, and an organic solvent.

13. A semiconductor device manufactured by the method of claim 12.

14. The method according to according to claim 12, wherein the polymer is a blend polymer of poly(N, N-dimethylacrylamide/3,3-dimethoxypropene/acrolein) and polyvinylphenol.

15. The method according to according to claim 12, wherein the melamine derivative is a compound represented by Formula 1:

[Formula 1]

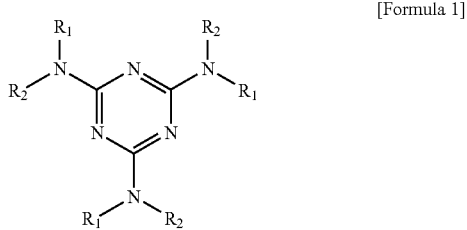

wherein $R_1$ and $R_2$ are individually a $C_1$–$C_{20}$ alkyl or $C_1$–$C_{10}$ ether group.

16. The method according to according to claim 15,, wherein the melamine derivative is a compound represented by Formula 1a:

[Formula 1a]

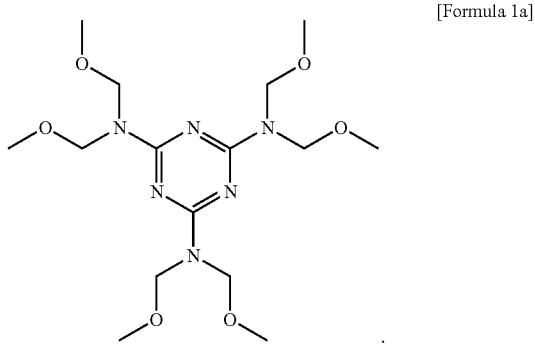

17. The method according to according to claim 12, wherein the melamine derivative is present in an amount ranging from 0.1 wt % to 20 wt % based on total weight of the photoresist composition.

18. The method according to according to claim 12, wherein the polymer has a molecular weight ranging from 5000 to 9000.

19. The method according to according to claim 12, wherein the polymer is present in an amount ranging from 2.5 wt % to 15 wt % based on total weight of the photoresist composition.

20. The method according to according to claim 12, wherein the photoacid generator is selected from the group consisting of phthalimidotrifluoromethane sulfonate, dinitrobenzyltosylate, n-decyl disulfone, and naphthylimido trifluoromethane sulfonate.

21. The method according to according to claim 12, wherein the photoacid generator comprises
   i) a first photoacid generator selected form the group consisting of phthalimidotrifluoromethane sulfonate, dinitrobenzyltosylate, n-decyl disulfone, and naphthylimido trifluoromethane sulfonate; and
   ii) a second photoacid generator selected from the group consisting of diphenyl iodide hexafluorophosphate, diphenyl iodide hexafluoroarsenate, diphenyl iodide hexafluoroantimonate, diphenyl p-methoxyphenylsulfonium triflate, diphenyl p-toluenylsulfonium triflate, diphenyl p-isobutylphenylsulfonium triflate, triphenylsulfonium hexafluoroarsenate, triphenylsulfonium hexafluoroantimonate, triphenylsulfonium triflate, and dibutylnaphthylsulfonium triflate.

22. The method according to according to claim 12, wherein the photoacid generator is present in an amount ranging from 0.05 wt % to 10 wt % based on total weight of the photoresist polymer.

23. The method according to according to claim 12, wherein the organic solvent is selected from diethylene glycol diethyl ether, methyl 3-methoxypropionate, ethyl 3-ethoxypropionate, propyleneglycol methyletheracetate, cyclohexanone, and mixtures thereof.

24. The method according to according to claim 12, wherein the organic solvent is present in an amount ranging from 500 wt % to 2000 wt % based on total weight of the photoresist polymer.

* * * * *